United States Patent
Ino et al.

(10) Patent No.: US 11,683,943 B2
(45) Date of Patent: Jun. 20, 2023

(54) MEMORY DEVICE WITH A PLURALITY OF METAL CHALCOGENIDE LAYERS

(71) Applicant: Kioxia Corporation, Tokyo (JP)

(72) Inventors: Tsunehiro Ino, Fujisawa Kanagawa (JP); Yukihiro Nomura, Taito Tokyo (JP); Kazuhiko Yamamoto, Fujisawa Kanagawa (JP); Koji Usuda, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 176 days.

(21) Appl. No.: 17/125,126

(22) Filed: Dec. 17, 2020

(65) Prior Publication Data

US 2021/0296400 A1    Sep. 23, 2021

(30) Foreign Application Priority Data

Mar. 19, 2020    (JP) ............................. JP2020-049899

(51) Int. Cl.
   *H10B 63/00*    (2023.01)
   *G11C 13/00*    (2006.01)
   (Continued)

(52) U.S. Cl.
   CPC ......... *H10B 63/80* (2023.02); *G11C 13/0004* (2013.01); *G11C 13/0007* (2013.01);
   (Continued)

(58) Field of Classification Search
   CPC ... H01L 27/2463; H01L 45/06; H01L 45/142; H01L 45/143; H01L 45/144;
   (Continued)

(56) References Cited

U.S. PATENT DOCUMENTS 10,090,460 B2    10/2018  Saito
10,283,707 B2     5/2019  Kamata
(Continued)

FOREIGN PATENT DOCUMENTS

JP    2008-066668 A     3/2008
JP        6238495 B2    11/2017
(Continued)

OTHER PUBLICATIONS

F. J. Di Salvo, et al., "Coexistence of two charge-density waves of different symmetry in 4Hb—TaSe$_2$", Physical Review B, vol. 14, No. 4, 1976, 4 pages.
(Continued)

*Primary Examiner* — Jerome Leboeuf
(74) *Attorney, Agent, or Firm* — Foley & Lardner LLP

(57) ABSTRACT

A memory device including a first conductive layer; a second conductive layer; a resistance change region provided between the first conductive layer and the second conductive layer; a first region provided between the resistance change region and the first conductive layer, the first region including a first element selected from the group consisting of niobium, vanadium, tantalum, and titanium, and a second element selected from the group consisting of oxygen, sulfur, selenium, and tellurium, the first region having a first atomic ratio of the first element to the second element; and a second region provided between the first region and the resistance change region, the second region including the first element and the second element, the second region having a second atomic ratio of the first element to the second element, the second atomic ratio being smaller than the first atomic ratio.

15 Claims, 12 Drawing Sheets

(51) Int. Cl.
   *H10N 70/20* (2023.01)
   *H10N 70/00* (2023.01)
(52) U.S. Cl.
   CPC ....... *H10N 70/231* (2023.02); *H10N 70/8822* (2023.02); *H10N 70/8825* (2023.02); *H10N 70/8828* (2023.02); *G11C 2213/76* (2013.01)
(58) Field of Classification Search
   CPC .............. H01L 45/005; H01L 45/1226; H01L 45/1233; H01L 27/2409; H01L 27/249; G11C 13/0004; G11C 13/0007; G11C 2213/76
   See application file for complete search history.

(56) References Cited

U.S. PATENT DOCUMENTS

| | | | | |
|---|---|---|---|---|
| 2016/0365133 | A1* | 12/2016 | Ino | G11C 11/221 |
| 2018/0198064 | A1* | 7/2018 | Chiang | H01L 27/249 |
| 2018/0277601 | A1 | 9/2018 | Ahn | |
| 2019/0296234 | A1* | 9/2019 | Yoshimura | G11C 13/0026 |
| 2021/0193922 | A1* | 6/2021 | Lee | H01L 45/144 |

FOREIGN PATENT DOCUMENTS

| | | |
|---|---|---|
| JP | 2018-67656 A | 4/2018 |
| JP | 2018-164085 A | 10/2018 |

OTHER PUBLICATIONS

F. J. Di Salvo, et al., "Effects of doping on charge-density waves in layer compounds", Physical Review B, vol. 12, No. 6, 1975, 17 pages.

John A. Wilson, "Questions concerning the form taken by the charge-density wave and the accompanying periodic-structural distortions in 2H—$TaSe_2$, and closely related materials", Physical Review B, vol. 17, No. 10, 1978, pp. 3880-3898.

Yoshinori Ezura, et al., "Single Crystal Growth and Electrical Conduction Properties of Pseudo-One-Dimensional Transmission Orthorhombic $TaS_3$", L-65, Proceedings of the 2014 College of Science and Technology, Nihon University, 2014.

S N Artemenko, et al., "Quasi-one-dimensional conductors with a charge density wave", Conferences and symposia, Physics—Uspekhi 39 (4), 1996, 6 pages.

* cited by examiner

MEMORY DEVICE WITH A PLURALITY OF METAL CHALCOGENIDE LAYERS

CROSS-REFERENCE TO RELATED APPLICATION

This application is based upon and claims the benefit of priority from Japanese Patent Application No. 2020-049899, filed on Mar. 19, 2020, the entire contents of which are incorporated herein by reference.

FIELD

Embodiments described herein relate generally to a memory device.

BACKGROUND

As a large-capacity non-volatile memory device, there is a cross-point type 2-terminal memory device. The cross-point type 2-terminal memory device makes it easy to scale down and highly integrate memory cells.

Examples of the two-terminal memory device include a resistive random access memory (ReRAM), a phase change memory (PCM), a ferroelectric random access memory (FeRAM), and a magnetoresistive random access memory (MRAM). The two-terminal memory device includes a resistance change element in which resistance of a memory cell changes by application of voltage or current. For example, a high resistance state of the resistance change element is defined as data "0", and a low resistance state of the resistance change element is defined as data "1". The memory cell can maintain different resistance states, and therefore can store 1-bit data of "0" and "1".

In a cross-point type memory array, for example, a large number of metal wires called bit lines and word lines are cross-arranged, and memory cells are formed at intersections of the bit lines and word lines. Writing in one memory cell is performed by applying voltage to a bit line and a word line connected to the memory cell.

Many memory cells are connected to one bit line and one word line. Therefore, for example, at the time of writing, a voltage (semi-selective voltage: lower than that of a selected memory cell) is also applied to a large number of memory cells (semi-selected memory cells) connected to the same bit line and word line as a memory cell to be written (selected memory cell), and a current (semi-selective leak current) flows in the large number of memory cells. When this semi-selective leak current is large, for example, power consumption of a chip is increased. In addition, a voltage drop in the wires increases, and a sufficiently high voltage is not applied to the selected memory cell. Therefore, in the cross-point type memory array, it is necessary to achieve a memory cell having a small semi-selective leak current.

In order to achieve the memory cell having a small semi-selective leak current, for example, a switching element connected in series to a resistance change element is provided. The switching element has non-linear current-voltage characteristics in which a current sharply rises at a specific voltage (hereinafter referred to as a threshold voltage). The switching element can suppress a semi-selective leak current flowing in a semi-selected memory cell.

DETAILED DESCRIPTION

Figure 1:
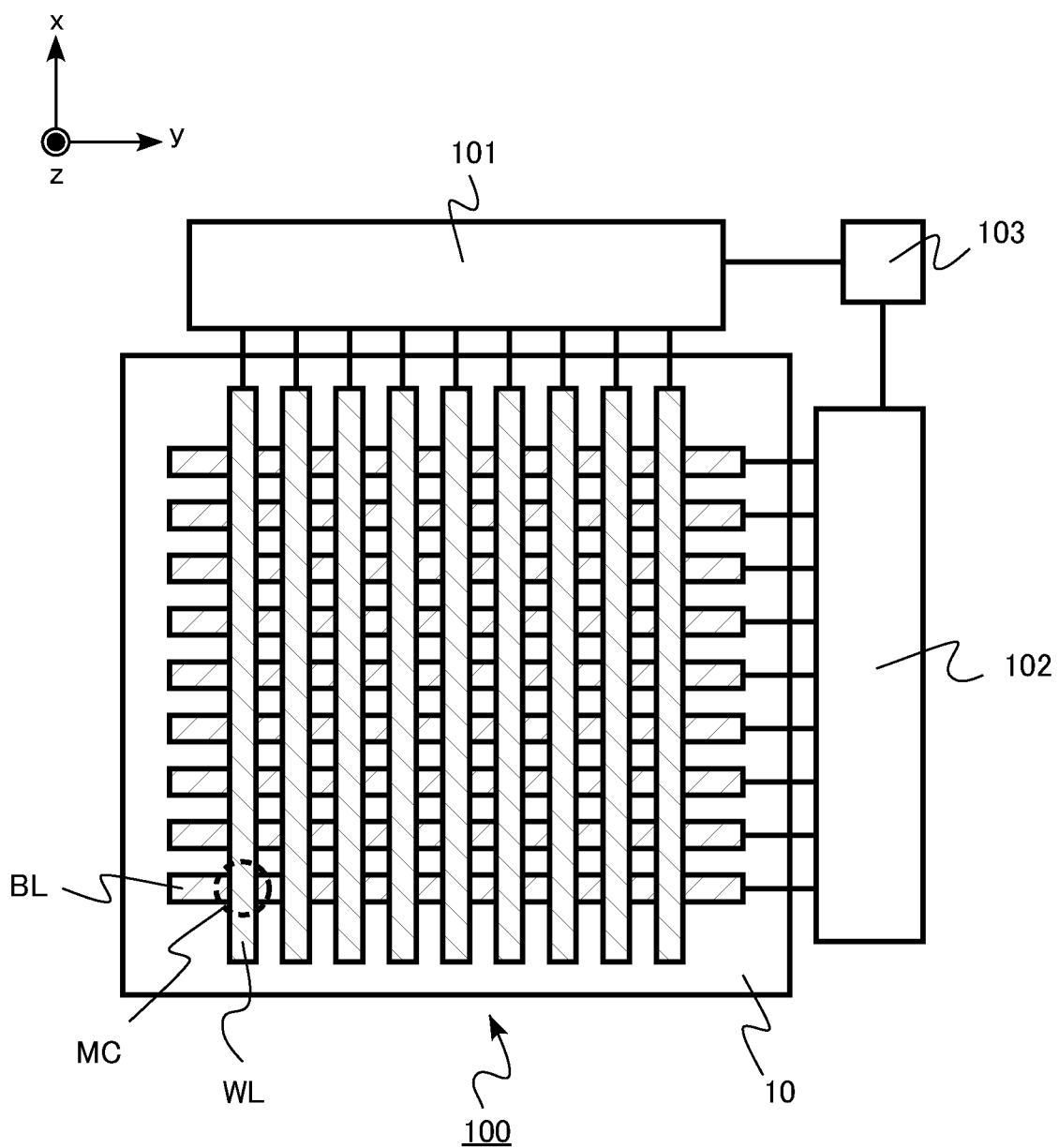
FIG. 1 is a block diagram of a memory cell array and peripheral circuits of a memory device of a first embodiment.

A memory device of an embodiment includes: a first conductive layer; a second conductive layer; a resistance change region provided between the first conductive layer and the second conductive layer; a first region provided between the resistance change region and the first conductive layer, including a first element selected from the group consisting of niobium (Nb), vanadium (V), tantalum (Ta), and titanium (Ti), and a second element selected from the group consisting of oxygen (O), sulfur (S), selenium (Se), and tellurium (Te), and having a first atomic ratio of the first element to the second element; and a second region provided between the first region and the resistance change region, including the first element and the second element, and having a second atomic ratio of the first element to the second element, the second atomic ratio being smaller than the first atomic ratio.

Hereinafter, embodiments will be described with reference to the drawings. Incidentally, in the following description, the same sign will be given to the same or a similar member or the like, and description of a member or the like described once will be omitted appropriately.

In the present specification, a term "upper" or "lower" may be used for convenience. "Upper" or "lower" is a term indicating a relative positional relationship in the drawings, and is not a term defining a positional relationship with respect to gravity.

Qualitative analysis and quantitative analysis of a chemical composition of a member constituting a memory device in the present specification can be performed by, for example, secondary ion mass spectroscopy (SIMS), energy dispersive X-ray spectroscopy (EDX), or electron energy loss spectroscopy (EELS). For measuring the thickness of a member constituting a memory device, a distance between members, and the like, for example, a transmission electron microscope (TEM) can be used. For identification of a crystal system of a member constituting a memory device and comparison in the magnitude of an abundance ratio of the crystal system, for example, a transmission electron microscope, X-ray diffraction (XRD), electron beam diffraction (EBD), X-ray photoelectron spectroscopy (XPS), or synchrotron radiation X-ray absorption fine structure (XAFS) can be used. For confirmation of presence or absence of an oriented or ordered structure of a member constituting a memory device, for example, TEM or XRD can be used. For confirmation of a thickness of a region in a member constituting a memory device, for example, TEM or XRD can be used.

First Embodiment

A memory device of a first embodiment includes: a first conductive layer; a second conductive layer; a resistance change region provided between the first conductive layer and the second conductive layer; a first region provided between the resistance change region and the first conductive layer, including a first element selected from the group consisting of niobium (Nb), vanadium (V), tantalum (Ta), and titanium (Ti), and a second element selected from the group consisting of oxygen (O), sulfur (S), selenium (Se), and tellurium (Te), and having a first atomic ratio of the first element to the second element; and a second region provided between the first region and the resistance change region, including the first element and the second element, and having a second atomic ratio of the first element to the second element, the second atomic ratio being smaller than the first atomic ratio.

In addition, the memory device of the first embodiment includes: a plurality of first wires; a plurality of second wires intersecting with the first wires; and a memory cell disposed in at least one of regions where the first wires intersect with the second wires, in which the memory cell includes: a resistance change region provided between the first wire and the second wire; a first region provided between the resistance change region and the first wire, including a first element selected from the group consisting of niobium (Nb), vanadium (V), tantalum (Ta), and titanium (Ti), and a second element selected from the group consisting of oxygen (O), sulfur (S), selenium (Se), and tellurium (Te), and having a first atomic ratio of the first element to the second element; and a second region provided between the first region and the resistance change region, including the first element and the second element, and having a second atomic ratio of the first element to the second element, the second atomic ratio being smaller than the first atomic ratio.

The memory device of the first embodiment is a resistance change memory, for example, a phase change memory or a memory using a superlattice type structure. A memory including chalcogenite as a main component may be used. These memories are named after a main resistance change mechanism in a material including chalcogenite as a main component, that is, a resistance change due to a change or a displacement of a crystal structure in a resistance change layer, and store data using the resistance change.

FIG. 1 is a block diagram of a memory cell array and peripheral circuits of the memory device of the first embodiment. A region indicated by a dotted line in a memory cell array 100 in FIG. 1 is one memory cell MC.

The memory cell array 100 of the memory device of the first embodiment includes, for example, a plurality of bit lines BL and a plurality of word lines WL intersecting with the plurality bit lines BL via an insulating layer (not illustrated) on a semiconductor substrate 10. The word lines WL are provided above the bit lines BL. Around the memory cell array 100, a first control circuit 101, a second control circuit 102, and a sense circuit 103 are provided as peripheral circuits.

The bit line BL is an example of a first conductive layer and a first wire. The word line WL is an example of a second conductive layer and a second wire.

A plurality of memory cells MC is provided in regions where the word lines WL intersect with the bit lines BL. The memory device of the first embodiment is a two-terminal phase change memory having a cross point structure. The memory cell MC is a two-terminal element.

Each of the plurality of word lines WL is connected to the first control circuit 101. Each of the plurality of bit lines BL is connected to the second control circuit 102. The sense circuit 103 is connected to the first control circuit 101 and the second control circuit 102.

The first control circuit 101 and the second control circuit 102 have functions of, for example, selecting a desired memory cell MC, writing data in the memory cell MC, reading data of the memory cell, and erasing data of the memory cell.

At the time of reading data, data in the memory cell MC is read as the amount of current flowing between the word line WL and the bit line BL. The sense circuit 103 has a function of determining the amount of current and deciding a value of the data. The sense circuit 103 determines, for example, "0" and "1" of the data. The sense circuit 103 determines the amount of current flowing in the memory cell MC and decides a value of the data.

At the time of writing data, the first control circuit 101 and the second control circuit 102 appropriately control the magnitude and application time of a voltage pulse applied between the word line WL and the bit line BL, and write data of a desired value in the memory cell MC.

The first control circuit 101, the second control circuit 102, and the sense circuit 103 are each constituted by, for example, an electronic circuit using a semiconductor device formed on the semiconductor substrate 10.

Figure 2A:
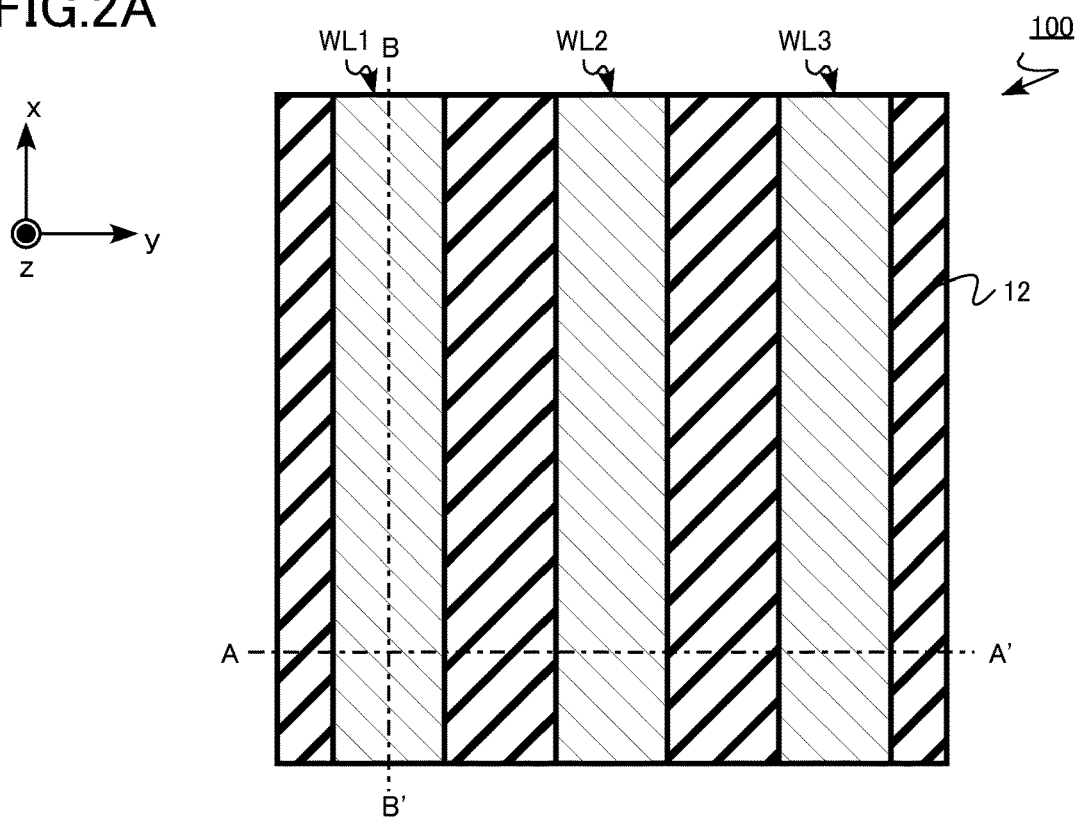
FIGS. 2A, 2B, and 2C are schematic diagrams of a part of the memory cell array of the memory device of the first embodiment.
Figure 2B:
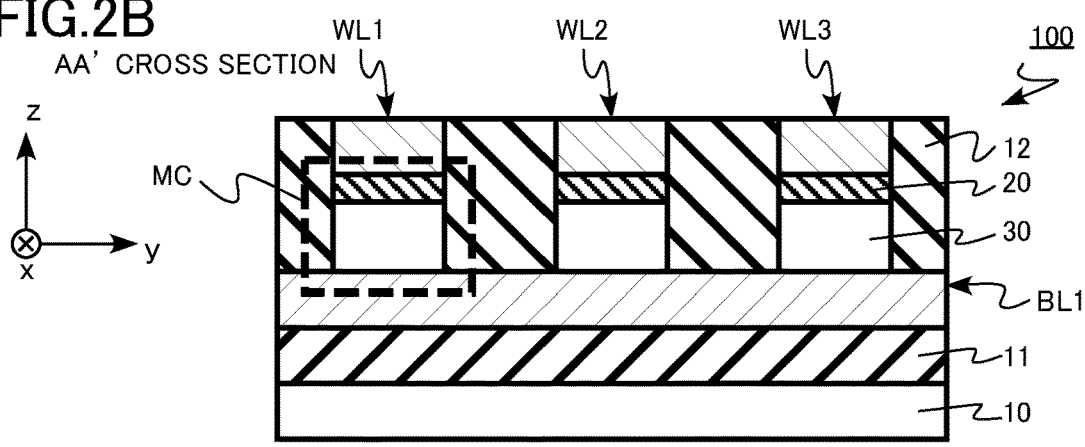
Figure 2C:
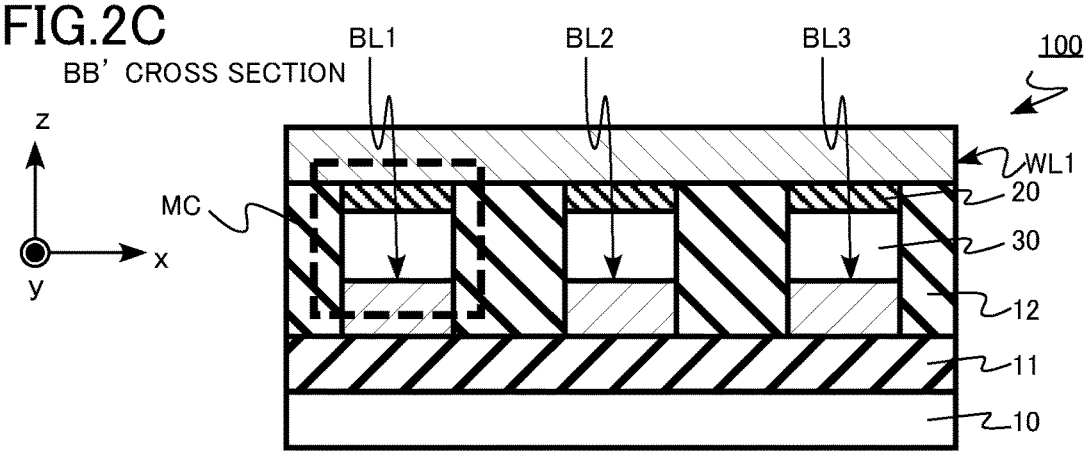

FIGS. 2A, 2B, and 2C are schematic diagrams of a part of the memory cell array of the memory device of the first embodiment. FIG. 2A is a top view, FIG. 2B is an AA' cross sectional view of FIG. 2A, and FIG. 2C is a BB' cross sectional view of FIG. 2A. For example, in FIGS. 2B and 2C, a region surrounded by a broken line is one memory cell MC.

Figure 3:
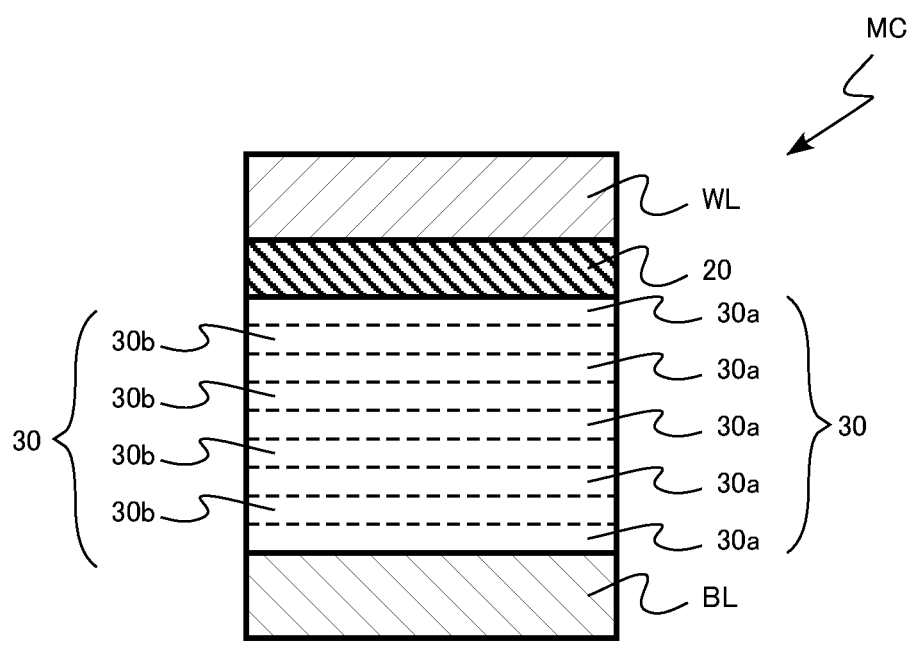
FIG. 3 is an enlarged schematic cross-sectional view of a memory cell of the memory device of the first embodiment.

FIG. 3 is an enlarged schematic cross-sectional view of a memory cell of the memory device of the first embodiment. FIG. 3 is an enlarged view of the region surrounded by the broken line in FIG. 2B.

The memory cell array 100 includes the semiconductor substrate 10, a word line WL1, a word line WL2, a word line WL3, a bit line BL1, a bit line BL2, a bit line BL3, a first interlayer insulating layer 11, a second interlayer insulating layer 12, a resistance change layer 20, and a selector layer (switch unit) 30. The selector layer 30 includes a first region 30a and a second region 30b.

The resistance change layer 20 is an example of the resistance change region.

Hereinafter, the word line WL1, the word line WL2, and the word line WL3 may be collectively referred to simply as a word line WL. The bit line BL1, the bit line BL2, and the bit line BL3 may be collectively referred to simply as a bit line BL.

The word line WL extends in an x direction. The word line WL contains, for example, a metal. The word line WL contains, for example, a metal having high heat resistance. The word line WL contains, for example, titanium nitride (TiN), tungsten nitride (WN), tantalum nitride (TaN), tungsten (W), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The bit line BL extends in a y direction. The y direction intersects with the x direction. The y direction is, for example, orthogonal to the x direction. The bit line BL contains, for example, a metal. The bit line BL contains, for example, a metal having high heat resistance. The bit line BL contains, for example, tungsten (W), titanium nitride (TiN), tungsten nitride (WN), tantalum nitride (TaN), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The word line WL and the bit line BL contain, for example, the same material. The word line WL and the bit line BL both contain, for example, titanium nitride.

The bit line BL has, for example, an oriented structure. A portion of the bit line BL in contact with the selector layer 30 contains, for example, a material having an oriented structure. Examples of the material having an oriented structure include carbon, nickel, molybdenum selenide, silicon carbide, platinum, cadmium sulfide, gallium nitride, gallium arsenide, and indium phosphide.

The semiconductor substrate 10 is, for example, of a silicon substrate.

The first interlayer insulating layer 11 is provided on the semiconductor substrate 10. The first interlayer insulating layer 11 is provided between the semiconductor substrate 10 and the bit line BL. The first interlayer insulating layer 11 contains, for example, silicon oxide.

The second interlayer insulating layer 12 is provided between the bit line BL and the bit line BL, and between the word line WL and the word line WL. The second interlayer insulating layer 12 contains, for example, silicon oxide.

The resistance change layer 20 is provided between the bit line BL and the word line WL.

The resistance change layer 20 stores data by a change in a resistance state. The resistance change layer 20 functions as a resistance change element.

In addition, the resistance change layer 20 can rewrite data by application of voltage or current. The resistance change layer 20 transitions between a high resistance state and a low resistance state by application of voltage or current. For example, the high resistance state is defined as data "0", and the low resistance state is defined as data "1". The memory cell MC stores 1-bit data of "0" and "1".

The resistance change layer 20 contains, for example, a compound including germanium (Ge), antimony (Sb), and tellurium (Te). The resistance change layer 20 contains, for example, an alloy having a chemical composition of $Ge_2Sb_2Te_5$.

The resistance change layer 20 may have a superlattice structure. The resistance change layer 20 contains, for example, $Ge_2Sb_2Te_5$, and has a superlattice structure in which $Ge_2Te_2$ regions and $Sb_2Te_3$ regions are alternately stacked. By application of voltage or current, the position of germanium (Ge) changes in the superlattice structure, and the superlattice structure transitions between a high resistance state and a low resistance state.

The selector layer 30 is provided between the bit line BL and the word line WL. The selector layer 30 is provided between the bit line BL and the resistance change layer 20.

The selector layer 30 has non-linear current-voltage characteristics in which a current sharply rises at a specific voltage (threshold voltage). The selector layer 30 has a function of suppressing an increase in a semi-selective leak current flowing in a semi-selected memory cell. The selector layer 30 functions as a switching element. The threshold voltage of the selector layer 30 is, for example, equal to or more than 0.5 V and equal to or less than 3.0 V.

The selector layer 30 contains a first element X selected from the group consisting of niobium (Nb), vanadium (V), tantalum (Ta), and titanium (Ti), and a second element Y selected from the group consisting of oxygen (O), sulfur (S), selenium (Se), and tellurium (Te). The selector layer 30 includes the first region 30a and the second region 30b. For example, the number of first region 30a may be 2 to 30. The number of second region 30b may be 2 to 30.

The first region 30a contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te).

The second region 30b is provided between the first region 30a and the resistance change layer 20.

The second region 30b contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te).

The first region 30a and the second region 30b of the selector layer 30 each contain niobium oxide, vanadium oxide, tantalum oxide, titanium oxide, niobium sulfide, vanadium sulfide, tantalum sulfide, titanium sulfide, niobium selenide, vanadium selenide, tantalum selenide, titanium selenide, niobium telluride, vanadium telluride, tantalum telluride, or titanium telluride.

The first region 30a has a first atomic ratio (X/Y) of the first element X to the second element Y. The second region 30b has a second atomic ratio (X/Y) of the first element X to the second element Y.

The second atomic ratio is smaller than the first atomic ratio. In other words, the ratio of the first element X contained in the second region 30b is smaller than the ratio of the first element X contained in the first region 30a. In other words, the ratio of the first element X contained in the first region 30a is larger than the ratio of the first element X contained in the second region 30b. The second atomic ratio is, for example, equal to or less than 80% of the first atomic ratio.

For example, when the first element X is niobium (Nb) and the second element Y is oxygen (O), for example, the first region 30a contains NbO and the second region 30b contains $NbO_2$. In this case, the first atomic ratio is 1, and the second atomic ratio is 0.5. The second atomic ratio is 50% of the first atomic ratio.

In the memory cell MC of the first embodiment, five layers of the first region 30a and four layers of the second region 30b are alternately stacked between the bit line BL and the word line WL. The first region 30a disposed between the second region 30b and the resistance change layer 20 is an example of a third region.

The first region 30a disposed between the second region 30b and the resistance change layer 20 contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te). The first region 30a disposed between the second region 30b and the resistance change layer 20 has a third atomic ratio (X/Y) of the first element X to the second element Y. The third atomic ratio is larger than the second atomic ratio.

For example, the selector layer 30 has a superlattice structure. For example, the selector layer 30 has a superlattice structure in which the first region 30a and the second region 30b are alternately stacked. For example, when the first element X is niobium (Nb) and the second element Y is oxygen (O), for example, the first region 30a contains NbO and the second region 30b contains $NbO_2$. For example, the selector layer 30 has a superlattice structure in which NbO and $NbO_2$ are alternately stacked.

The thickness of the selector layer 30 in a direction from the bit line BL to the word line WL is, for example, equal to or more than 5 nm and equal to or less than 20 nm. The thickness of the first region 30a in a direction from the bit line BL to the word line WL is, for example, equal to or more than 0.1 nm and equal to or less than 1 nm. The thickness of the second region 30b in a direction from the bit line BL to the word line WL is, for example, equal to or more than 0.1 nm and equal to or less than 1 nm. The thickness of the first region 30a may be the same as or different from the thickness of the second region 30b.

Next, functions and effects of the memory device of the first embodiment will be described.

As described above, the resistance change layer 20 transitions between a high resistance state and a low resistance state by application of voltage or current. For example, the high resistance state is defined as data "0", and the low resistance state is defined as data "1". The memory cell MC stores 1-bit data of "0" and "1".

Figure 4:
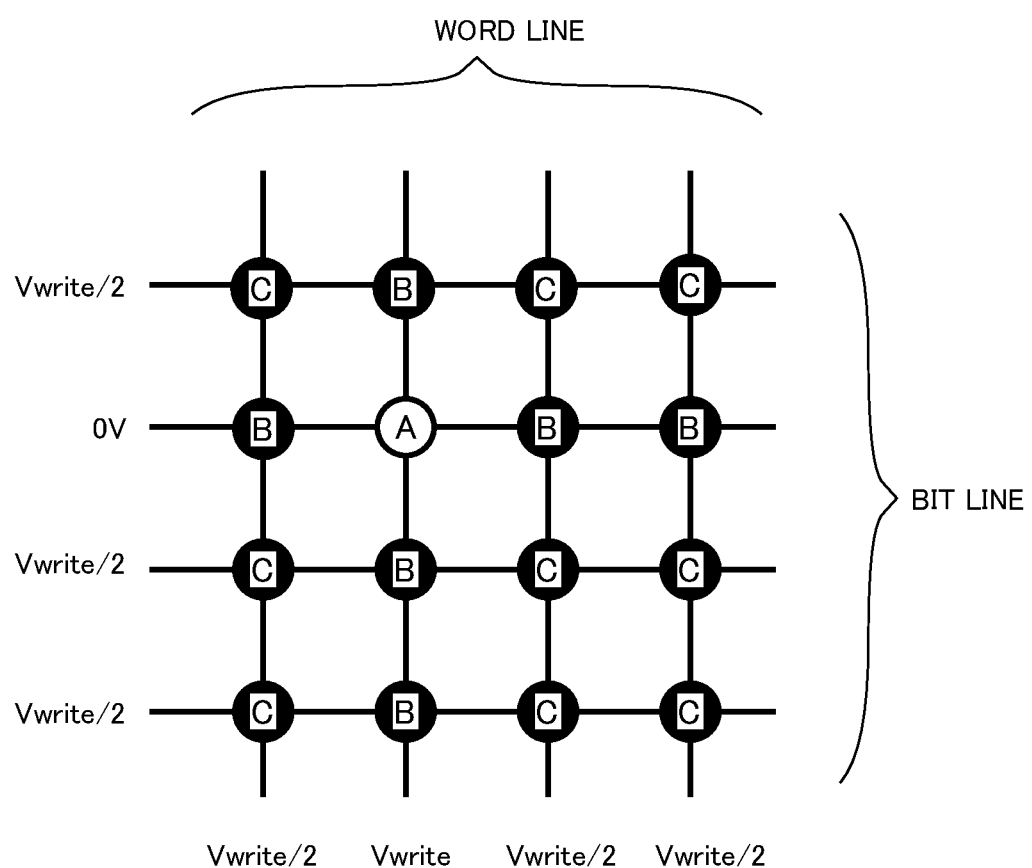
FIG. 4 is a diagram for explaining a problem of the memory device of the first embodiment.

FIG. 4 is a diagram for explaining a problem of the memory device of the first embodiment. FIG. 4 illustrates voltage applied to one memory cell MC in the memory cell array when the memory cell MC is selected for a write operation. An intersection of a word line and a bit line represents each memory cell MC.

A selected memory cell MC is a memory cell A (selected memory cell). A write voltage Vwrite is applied to a word line connected to the memory cell A. 0 V is applied to a bit line connected to the memory cell A.

Hereinafter, a case where a half of the write voltage (Vwrite/2) is applied to a word line and a bit line not connected to the memory cell A will be described as an example.

A voltage applied to a memory cell C (non-selected memory cell) connected to a word line and a bit line not connected to the memory cell A is 0 V. That is, no voltage is applied.

Meanwhile, a half of the write voltage Vwrite (Vwrite/2) is applied to the memory cell B (semi-selected memory cell) connected to a word line or a bit line connected to the memory cell A. Therefore, a semi-selective leak current flows in the memory cell B (semi-selected cell).

When this semi-selective leak current is large, for example, power consumption of a chip is increased. For example, a voltage drop in the wires increases, a sufficiently high voltage is not applied to a selected memory cell, and a write operation becomes unstable.

Figure 5:
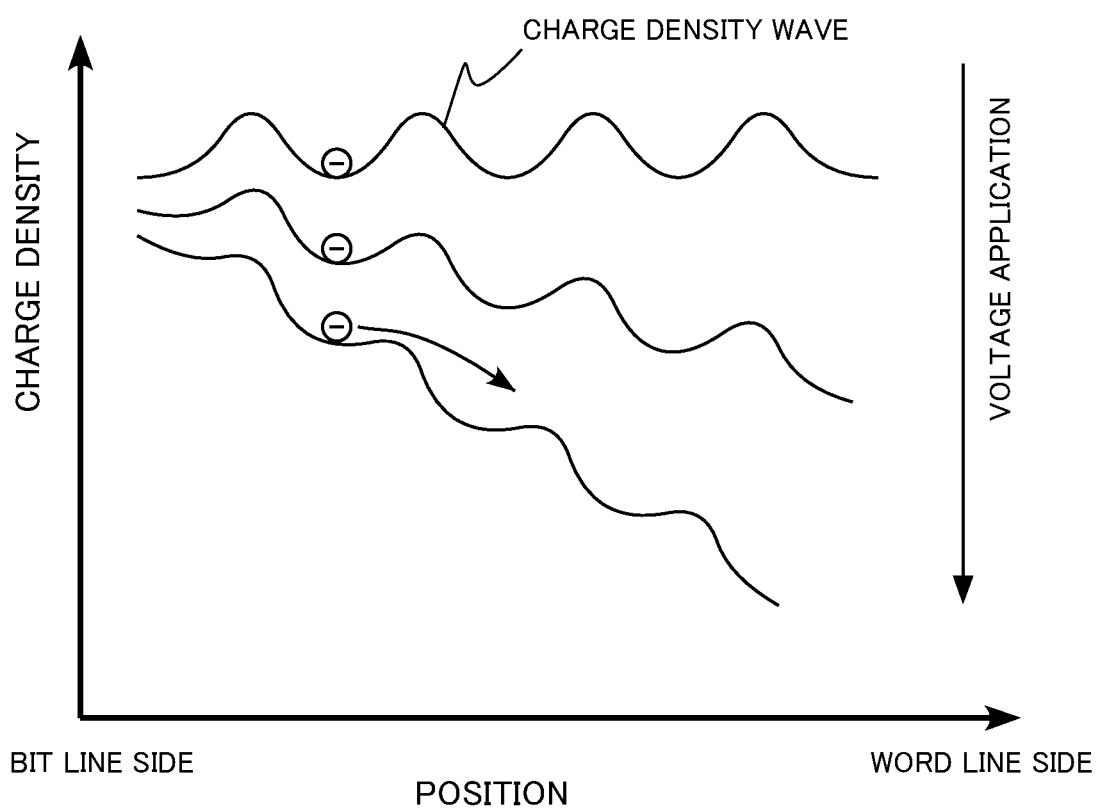
FIG. 5 is a graph for explaining functions and effects of the memory device of the first embodiment.

FIG. 5 is a graph for explaining functions and effects of the memory device of the first embodiment. Hereinafter, a case where the first element X contained in the selector layer 30 is niobium (Nb) and the second element Y is oxygen (O) will be described as an example. In this case, for example, the first region 30a contains NbO and the second region 30b contains $NbO_2$. For example, the selector layer 30 has a superlattice structure in which NbO and $NbO_2$ are alternately stacked.

FIG. 5 is a graph illustrating a charge density in the selector layer 30. FIG. 5 illustrates a charge density distribution in a direction from the bit line BL to the word line WL.

The charge density of the first region 30a formed by NbO is lower than the charge density of the second region 30b formed by $NbO_2$. Therefore, a charge density wave in which the first region 30a is a peak and the second region 30b is a valley is formed in the direction from the bit line BL to the word line WL.

As illustrated in FIG. 5, when a voltage applied between the bit line BL and the word line WL is increased, electrons that have fallen into a valley of the charge density wave flow out when the voltage exceeds a specific voltage. This specific voltage is the threshold voltage (Vth) of the selector layer 30.

Figure 6:
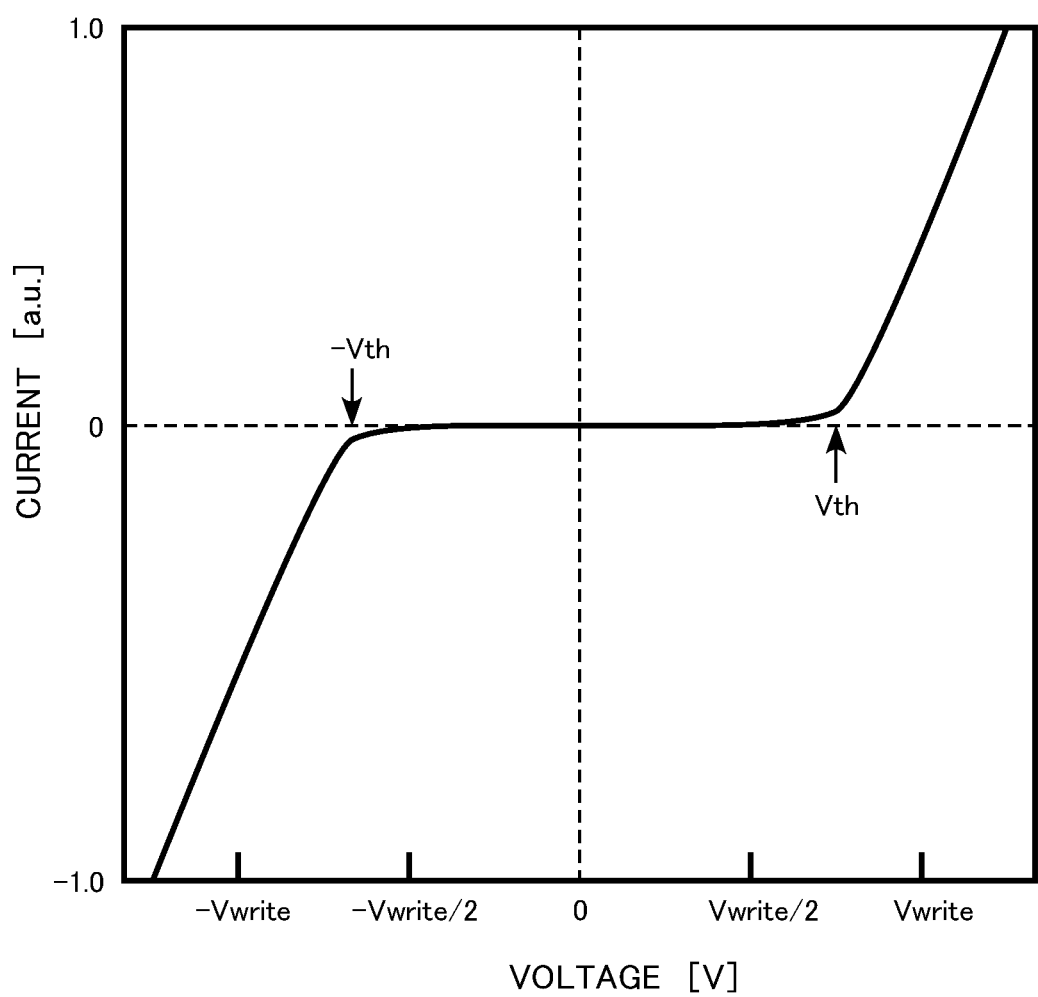
FIG. 6 is a graph for explaining functions and effects of the memory device of the first embodiment.

FIG. 6 is a graph for explaining functions and effects of the memory device of the first embodiment. FIG. 6 is a graph illustrating current-voltage characteristics of the selector layer 30.

As illustrated in FIG. 6, the current-voltage characteristics of the selector layer 30 indicate non-linear characteristics in which a current sharply rises when an applied voltage exceeds the threshold voltage (Vth). The threshold voltage (Vth) of the selector layer 30 is lower than the write voltage Vwrite and higher than a half of the write voltage Vwrite (Vwrite/2). Since a current flowing in the resistance change layer 20 connected in series to the selector layer 30 in a region equal to or lower than the threshold voltage Vth is small, a semi-selective leak current flowing in a semi-selected cell can be suppressed.

The threshold voltage (Vth) of the selector layer 30 can be adjusted by, for example, changing the chemical composition, crystal orientation, crystallinity, or thickness of the first region 30a or the second region 30b. The threshold voltage (Vth) of the selector layer 30 can be adjusted by, for example, changing the lamination number of layers of the first region 30a and the second region 30b.

According to the first embodiment, a memory device capable of suppressing a semi-selective leak current can be achieved.

The selector layer 30 of the first embodiment uses a charge density wave in order to achieve non-linear characteristics. Therefore, the selector layer 30 does not undergo a change in the physical structure such as a change in the crystal state in order to achieve the non-linear characteristics. Therefore, the selector layer 30 having low loss and high reliability can be achieved.

When the selector layer 30 is formed on a bit line BL, the bit line BL preferably has an oriented structure from a viewpoint of improving the crystal orientation of the selector layer. A portion of the bit line BL in contact with the selector layer 30 preferably contains a material having an oriented structure. The material having an oriented structure is preferably carbon, nickel, molybdenum selenide, silicon carbide, platinum, cadmium sulfide, gallium nitride, gallium arsenide, or indium phosphide.

As described above, according to the first embodiment, a memory device capable of suppressing a semi-selective leak current can be achieved.

Second Embodiment

A memory device of a second embodiment is different from the memory device of the first embodiment in the matters of composition modulation of a selector. Hereinafter, matters overlapping with the first embodiment will be partially omitted.

A selector layer 30 contains a first element X selected from the group consisting of niobium (Nb), vanadium (V), tantalum (Ta), and titanium (Ti), and a second element Y selected from the group consisting of oxygen (O), sulfur (S), selenium (Se), and tellurium (Te). The selector layer 30 includes a first region 30a and a second region 30b.

The first region 30a contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te).

The second region 30b is provided between the first region 30a and the resistance change layer 20.

The second region 30b contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te).

The first region 30a and the second region 30b of the selector layer 30 each contain niobium oxide, vanadium oxide, tantalum oxide, titanium oxide, niobium sulfide, vanadium sulfide, tantalum sulfide, titanium sulfide, niobium selenide, vanadium selenide, tantalum selenide, titanium selenide, niobium telluride, vanadium telluride, tantalum telluride, or titanium telluride.

The first region 30a has a first atomic ratio (X/Y) of the first element X to the second element Y. The second region 30b has a second atomic ratio (X/Y) of the first element X to the second element Y.

Also in the present embodiment, a relationship between the first atomic ratio and the second atomic ratio is similar to that in the first embodiment. Meanwhile, the composition of the first element X in the first region 30a is different from the composition of the first element X contained in the second region 30b, or the composition of the second element Y in the first region 30a is different from the composition of the second element Y contained in the second region 30b. Alternatively, both the composition of X and the composition of Y are different between the first region 30a and the second region 30b.

For example, when the first element X is niobium and tantalum (NbTa) and the second element Y is oxygen and sulfur (SO, sulfur oxide), for example, the composition of the element X in the first region 30a is $Nb_{0.9}Ta_{0.1}$ and the composition of the element X in the second region 30b is $Nb_{0.7}Ta_{0.3}$, or the composition of the element Y in the first region 30a is $S_{0.1}O_{0.9}$ and the composition of the element Y in the second region 30b is $S_{0.2}O_{0.8}$. Alternatively, both the composition of the element X and the composition of the element Y may be different between the first region 30a and the second region 30b.

As described above, according to the second embodiment, a memory device capable of suppressing a semi-selective leak current can be achieved.

Third Embodiment

A memory device of a third embodiment is different from the memory device of the first embodiment in that a third conductive layer is further provided between a second region and a resistance change region. Hereinafter, matters overlapping with the first embodiment will be partially omitted.

Figure 7:
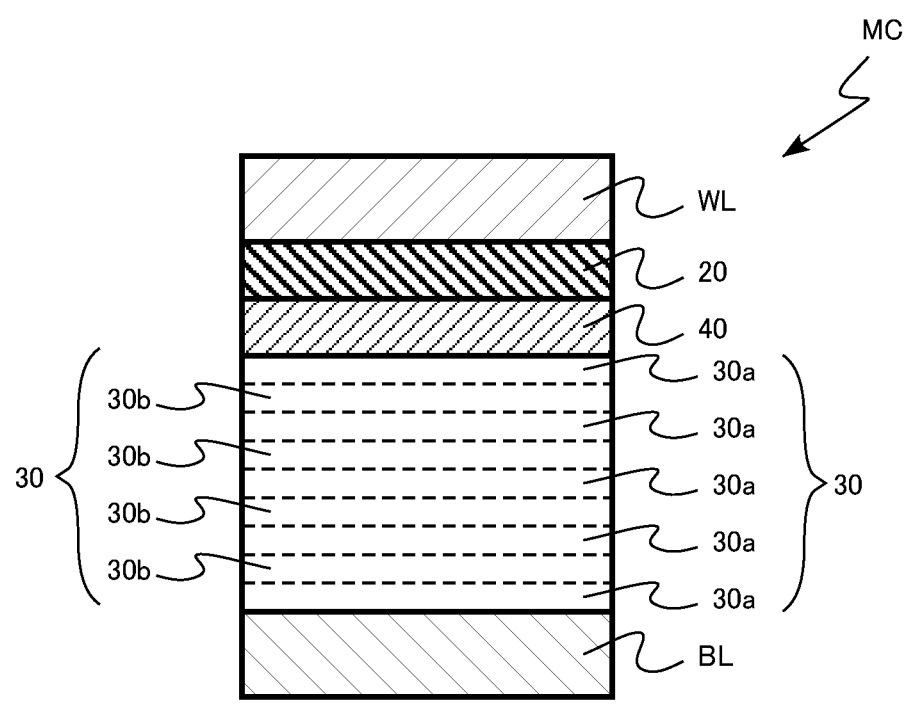
FIG. 7 is an enlarged schematic cross-sectional view of a memory cell of a memory device of a third embodiment.

FIG. 7 is an enlarged schematic cross-sectional view of a memory cell of the memory device of the third embodiment. FIG. 7 corresponds to FIG. 3 of the first embodiment.

A memory cell MC includes a word line WL, a bit line BL, a resistance change layer 20, a selector layer 30, and an intermediate layer 40. The intermediate layer 40 is an example of the third conductive layer.

The intermediate layer 40 is provided between the selector layer 30 and the resistance change layer 20. The intermediate layer 40 is provided between a second region 30b and the resistance change layer 20. The intermediate layer 40 is provided between a first region 30a and the resistance change layer 20.

The intermediate layer 40 has, for example, a function of suppressing a reaction between the selector layer 30 and the resistance change layer 20. In addition, the intermediate layer 40 has a function of reducing process damage to the selector layer 30, for example, when the resistance change layer 20 is formed on the selector layer 30. In addition, the intermediate layer 40 has a function of achieving stable formation of the resistance change layer 20, for example, when the resistance change layer 20 is formed on the selector layer 30.

Therefore, by providing the intermediate layer 40, a memory device having stable characteristics can be achieved.

The intermediate layer 40 is a conductor. The intermediate layer 40 contains, for example, a metal or a metal compound. The intermediate layer 40 contains, for example, titanium carbide (TiC), tungsten carbide (WC), tantalum carbide (TaC), titanium nitride (TiN), tungsten nitride (WN), tantalum nitride (TaN), tungsten (W), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

As described above, according to the third embodiment, a memory device capable of suppressing a semi-selective leak current can be achieved as in the first embodiment. In addition, a memory device having stable characteristics can be achieved.

Fourth Embodiment

A memory device of a fourth embodiment includes: a first conductive layer; a second conductive layer; a resistance change region provided between the first conductive layer and the second conductive layer; a first region provided between the resistance change region and the first conductive layer and including a first substance selected from the group consisting of carbon, niobium sulfide, tantalum sulfide, titanium sulfide, niobium selenide, tantalum selenide, tantalum telluride, bismuth selenide, indium selenide, and gallium telluride; and a second region provided between the first region and the resistance change region and including a second substance selected from the group consisting of molybdenum sulfide, tungsten sulfide, molybdenum selenide, tungsten selenide, molybdenum telluride, tungsten telluride, zirconium sulfide, zirconium selenide, hafnium sulfide, and hafnium selenide. The memory device of the fourth embodiment is different from the memory device of the first embodiment in that substances contained in the first region and the second region are different from those in the memory device of the first embodiment. Hereinafter, matters overlapping with the first embodiment will be partially omitted.

Figure 8:
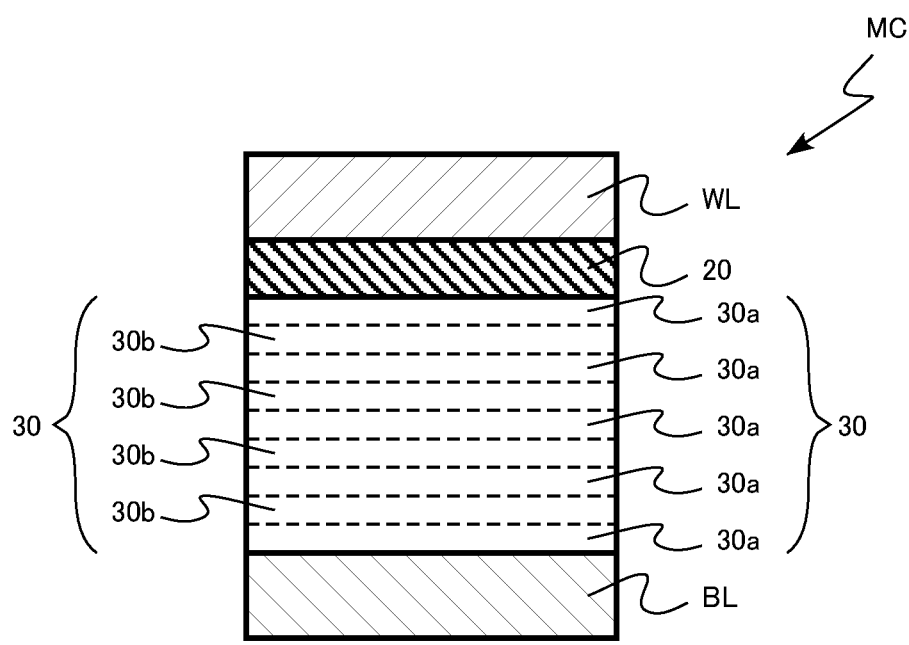
FIG. 8 is an enlarged schematic cross-sectional view of a memory cell of a memory device of a fourth embodiment.

FIG. 8 is an enlarged schematic cross-sectional view of a memory cell of the memory device of the fourth embodiment. FIG. 8 corresponds to FIG. 3 of the first embodiment.

A memory cell MC includes a word line WL, a bit line BL, a resistance change layer 20, and a selector layer 30. The selector layer 30 includes a first region 30a and a second region 30b.

In the memory cell MC of the fourth embodiment, five layers of the first region 30a and four layers of the second region 30b are alternately stacked between the bit line BL and the word line WL. The first region 30a disposed between the second region 30b and the resistance change layer 20 is an example of a third region.

The first region 30a contains a first substance selected from the group consisting of carbon, niobium sulfide, tantalum sulfide, titanium sulfide, niobium selenide, tantalum selenide, tantalum telluride, bismuth selenide, indium selenide, and gallium telluride. The niobium sulfide is, for example, $NbS_2$. The tantalum sulfide is, for example, $TaS_2$. The titanium sulfide is, for example, $TiS_2$. The niobium selenide is, for example, $NbSe_2$. The tantalum selenide is, for example, $TaSe_2$. The tantalum telluride is, for example, $TaTe_3$. The bismuth selenide is, for example, $Bi_2Se_3$. The indium selenide is, for example, InSe. The gallium telluride is, for example, GaTe.

The second region 30b contains a second substance selected from the group consisting of molybdenum sulfide, tungsten sulfide, molybdenum selenide, tungsten selenide, molybdenum telluride, tungsten telluride, zirconium sulfide, zirconium selenide, hafnium sulfide, and hafnium selenide. The molybdenum sulfide is, for example, $MoS_2$. The tungsten sulfide is, for example, $WS_2$. The molybdenum selenide is, for example, $MoSe_2$. The tungsten selenide is, for example, $WSe_2$. The molybdenum telluride is, for example, $MoTe_2$. The tungsten telluride is, for example, $WTe_2$. The zirconium sulfide is, for example, $ZrS_2$. The zirconium selenide is, for example, $ZrSe_2$. The hafnium sulfide is, for example, $HfS_2$. The hafnium selenide is, for example, $HfSe_2$.

The first region 30a and the second region 30b preferably each have a layered crystal structure. In particular, the closest interatomic distance in an interlayer direction is preferably wider than that in an in-layer direction. Furthermore, the first region 30a and the second region 30b each having a layered crystal structure are preferably stacked on each other. The layered crystal structure may form a superlattice structure in the interlayer direction.

The first substance constituting the first region 30a has a higher charge density than the second substance constituting the second region 30b. Therefore, when the first region 30a and the second region 30b are stacked on each other, a charge density wave is formed as in the first embodiment. Therefore, the current-voltage characteristics of the selector layer 30 indicate non-linear characteristics in which a current sharply rises when an applied voltage exceeds the threshold voltage (Vth).

According to the fourth embodiment, a memory device capable of suppressing a semi-selective leak current can be achieved.

Also in the fourth embodiment, an intermediate layer can be provided between the selector layer 30 and the resistance change layer 20 as in the third embodiment.

As described above, according to the fourth embodiment, a memory device capable of suppressing a semi-selective leak current can be achieved as in the first embodiment. In addition, a memory device having stable characteristics can be achieved.

Fifth Embodiment

A memory device of a fifth embodiment is different from that of the first embodiment in that a memory cell array has a three-dimensional structure. Hereinafter, matters overlapping with the first embodiment may be partially omitted.

The memory device of the fifth embodiment is a resistance change memory, for example, a phase change memory or a memory using a superlattice structure. A memory including chalcogenite as a main component can be used. These memories are named after a main resistance change mechanism in a material including chalcogenite as a main component, that is, a resistance change due to a structural change or a displacement of a crystal structure in a resistance change layer, and store data using the resistance change.

Figure 9:
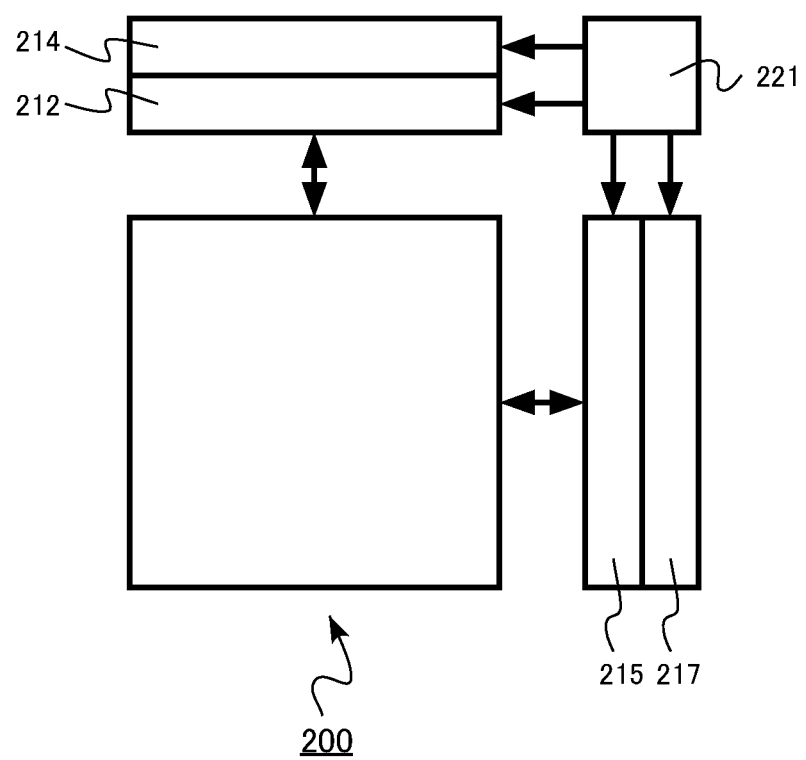
FIG. 9 is a block diagram of a memory device of a fifth embodiment.
Figure 10:
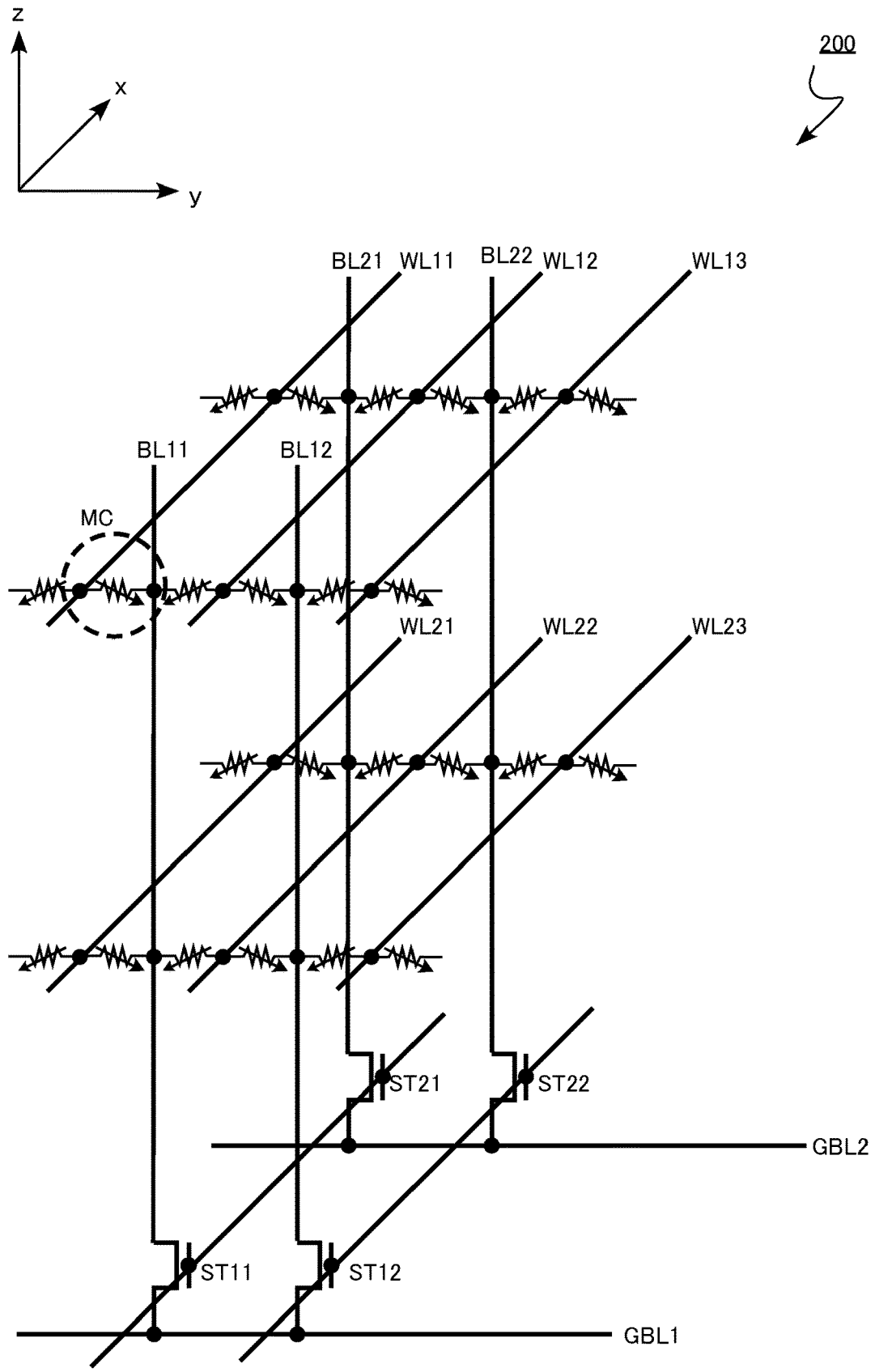
FIG. 10 is an equivalent circuit diagram of a memory cell array of the memory device of the fifth embodiment.

FIG. 9 is a block diagram of the memory device of the fifth embodiment. FIG. 10 is an equivalent circuit diagram of a memory cell array of the memory device of the fifth embodiment. FIG. 10 schematically illustrates a wire structure in the memory cell array. A memory cell array 200 of the fifth embodiment has a three-dimensional structure in which memory cells MC are three-dimensionally disposed.

As illustrated in FIG. 9, the memory device includes the memory cell array 200, a word line driver circuit 212, a row decoder circuit 214, a sense amplifier circuit 215, a column decoder circuit 217, and a control circuit 221.

As illustrated in FIG. 10, a plurality of memory cells MC is three-dimensionally disposed in the memory cell array 200. In FIG. 10, a region surrounded by a dotted line corresponds to one memory cell MC.

The memory cell array 200 includes, for example, a plurality of word lines WL (WL11, WL12, WL13, WL21, WL22, and WL23) and a plurality of bit lines BL (BL11, BL12, BL21, and BL22). The word line WL extends in an x direction. The bit line BL extends in a z direction. The word line WL intersects with the bit line BL vertically. A memory cell MC is disposed at an intersection of the word line WL and the bit line BL.

The plurality of word lines WL is electrically connected to the row decoder circuit 214. The plurality of bit lines BL is connected to the sense amplifier circuit 215. A selection transistor ST (ST11, ST21, ST12, and ST22) and a global bit line GBL (GBL1 and GBL2) are provided between the plurality of bit lines BL and the sense amplifier circuit 215.

The row decoder circuit 214 has a function of selecting a word line WL according to an input row address signal. The word line driver circuit 212 has a function of applying a predetermined voltage to a word line WL selected by the row decoder circuit 214.

The column decoder circuit 217 has a function of selecting a bit line BL according to an input column address signal. The sense amplifier circuit 215 has a function of applying a predetermined voltage to a bit line BL selected by the column decoder circuit 217. The sense amplifier circuit 215 also has a function of detecting and amplifying a current flowing between a selected word line WL and a selected bit line BL.

The control circuit 221 has a function of controlling the word line driver circuit 212, the row decoder circuit 214, the sense amplifier circuit 215, the column decoder circuit 217, and other circuits not illustrated.

Circuits such as the word line driver circuit 212, the row decoder circuit 214, the sense amplifier circuit 215, the column decoder circuit 217, and the control circuit 221 each include, for example, a transistor or a wiring layer using a semiconductor layer (not illustrated).

Figure 11A:
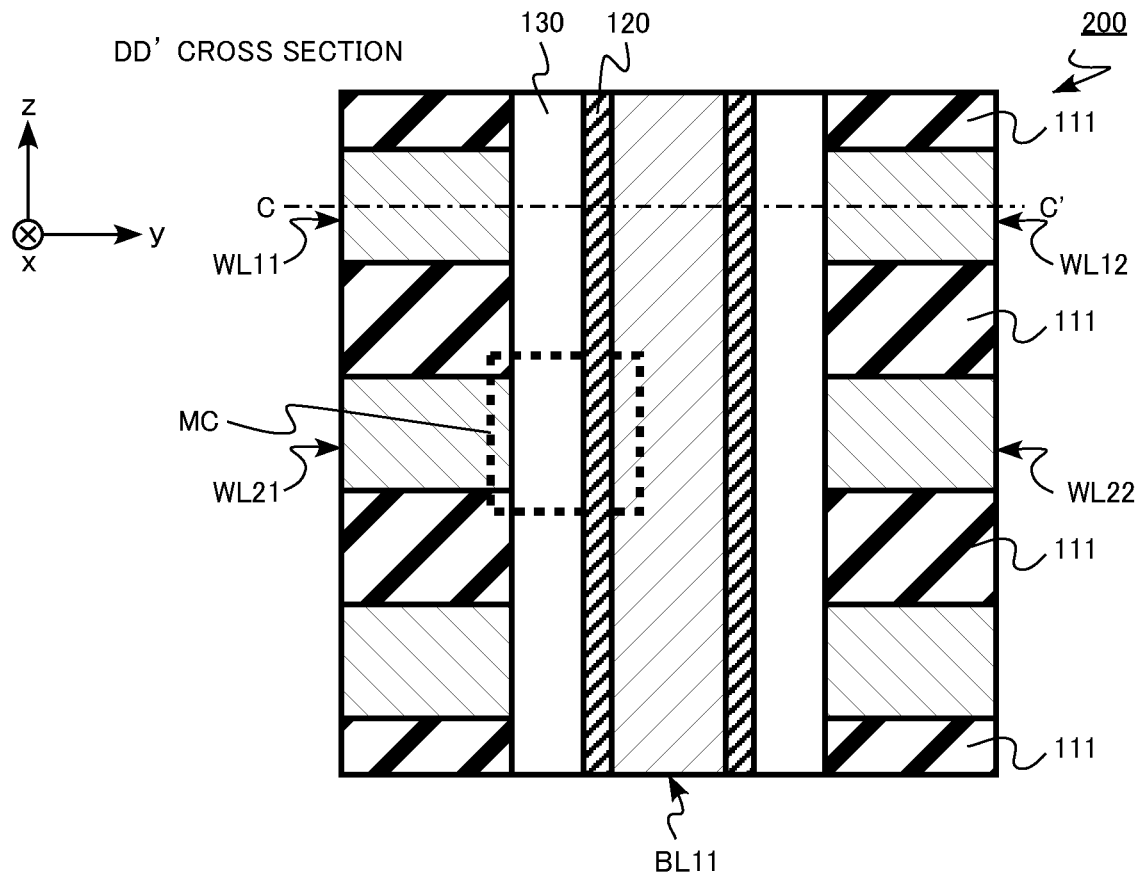
FIGS. 11A and 11B are schematic diagrams of a part of the memory cell array of the memory device of the fifth embodiment.
Figure 11B:
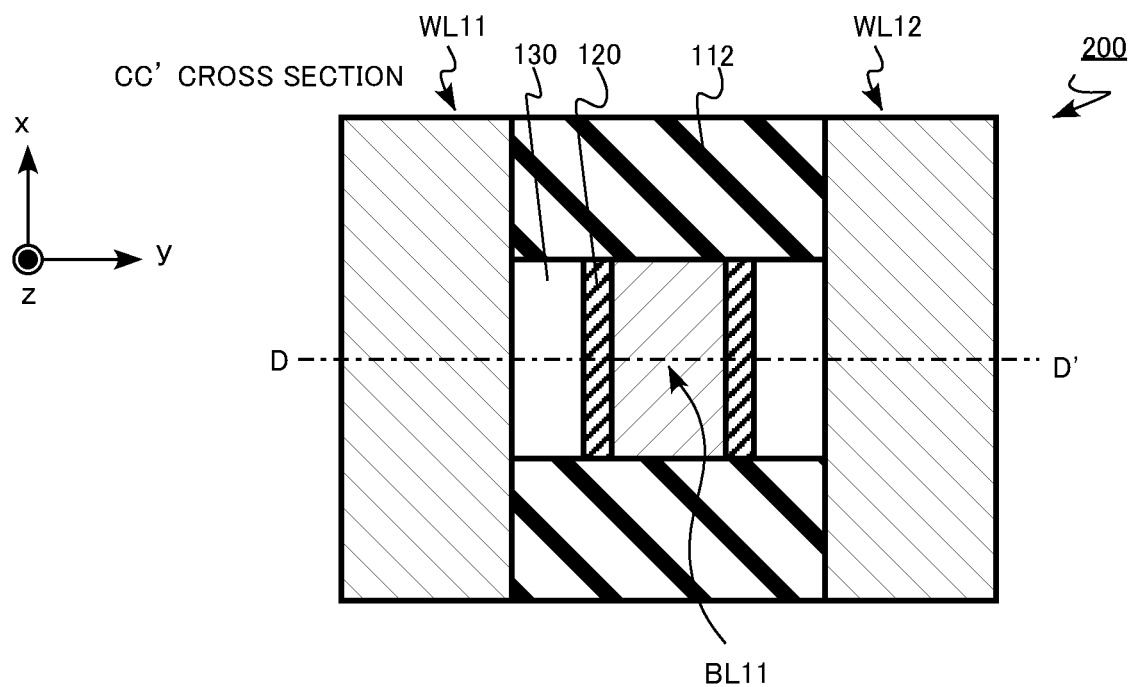

FIGS. 11A and 11B are schematic diagrams of a part of the memory cell array of the memory device of the fifth embodiment. FIG. 11A is a yz cross-sectional view of the memory cell array 200. FIG. 11B is an xy cross-sectional view of the memory cell array 200. FIG. 11A is a DD' cross-sectional view of FIG. 11B, and FIG. 11B is a CC' cross-sectional view of FIG. 11A. For example, in FIG. 11A, a region surrounded by a broken line is one memory cell MC.

Figure 12:
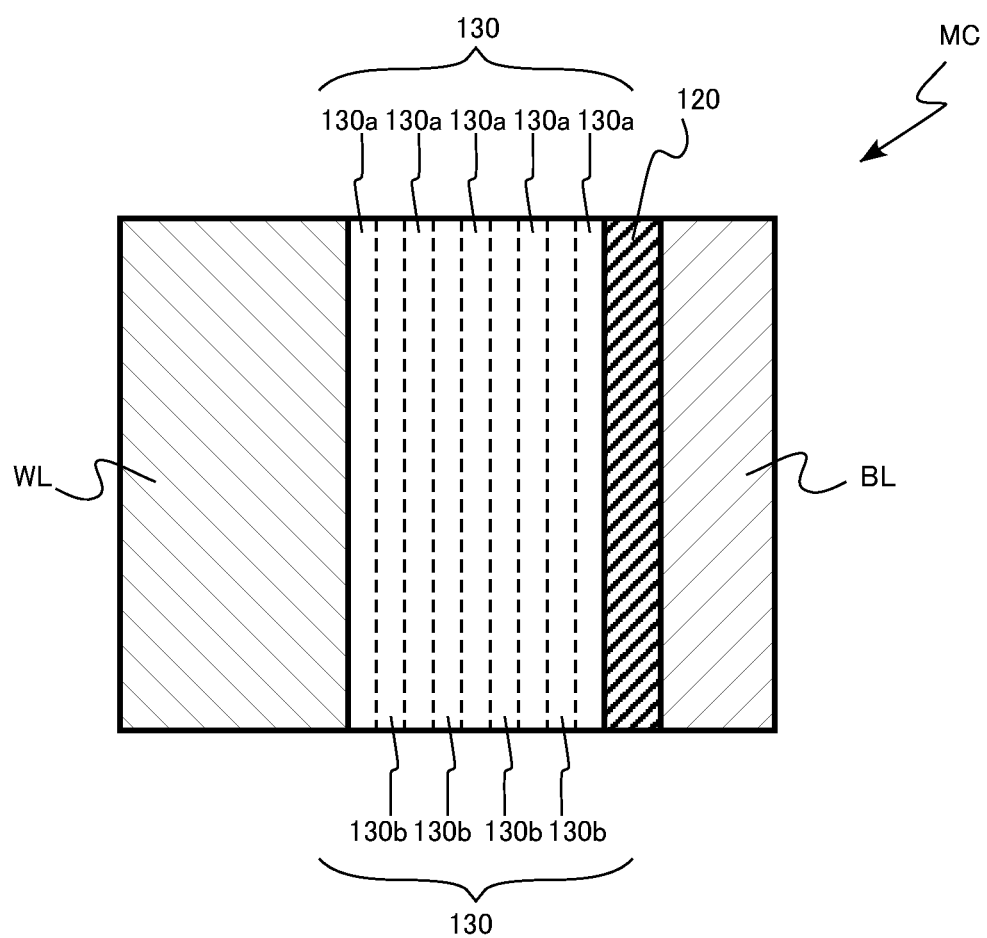
FIG. 12 is an enlarged schematic cross-sectional view of a memory cell of the memory device of the fifth embodiment.

FIG. 12 is an enlarged schematic cross-sectional view of a memory cell of the memory device of the fifth embodiment. FIG. 12 is an enlarged view of the memory cell MC surrounded by the broken line in FIG. 11A.

The memory cell array 200 includes a plurality of word lines including the word line WL11 and the word line WL21, a plurality of bit lines including the bit line BL11, a first interlayer insulating layer 111, a second interlayer insulating layer 112, a resistance change layer 120, and a selector layer 130. Hereinafter, the plurality of word lines including the word line WL11 and the word line WL21 may be collectively referred to simply as a word line WL. The plurality of bit lines including the bit line BL11 may be collectively referred to simply as a bit line BL.

The bit line BL is an example of a first conductive layer and a first wire. The word line WL is an example of a second conductive layer and a second wire.

The word line WL and the first interlayer insulating layer 111 are alternately stacked in the z direction. The word line WL extends in the x direction.

The word line WL contains, for example, a metal. The word line WL contains, for example, a metal. The word line WL contains, for example, a metal having high heat resistance. The word line WL contains, for example, titanium nitride (TiN), tungsten nitride (WN), tantalum nitride (TaN), tungsten (W), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The first interlayer insulating layer 111 is provided between the word line WL and the word line WL. The first interlayer insulating layer 111 contains, for example, silicon oxide. The first interlayer insulating layer 111 is an example of an insulating layer.

The bit line BL intersects with the word line WL. The bit line BL is provided between the word line WL and the word line WL.

The bit line BL extends in the z direction. The z direction intersects with the x direction. The z direction (second direction) is, for example, orthogonal to the x direction. The bit line BL contains, for example, a metal. The bit line BL contains, for example, a metal having high heat resistance. The bit line BL contains, for example, tungsten (W), titanium nitride (TiN), tungsten nitride (WN), tantalum nitride (TaN), tantalum (Ta), niobium (Nb), vanadium (V), iron (Fe), molybdenum (Mo), cobalt (Co), nickel (Ni), ruthenium (Ru), iridium (Ir), copper (Cu), palladium (Pd), silver (Ag), or platinum (Pt).

The word line WL has, for example, an oriented structure. A portion of the word line WL in contact with the selector layer 130 contains, for example, a material having an oriented structure. Examples of the material having an oriented structure include carbon, nickel, molybdenum selenide, silicon carbide, platinum, cadmium sulfide, gallium nitride, gallium arsenide, and indium phosphide. Incidentally, when the positions of the resistance change layer and the selector layer are switched with each other, the bit line BL may have an oriented structure, and a portion of the bit line BL in contact with the selector layer 130 can contain, for example, any of the above-described materials having oriented structures.

The second interlayer insulating layer 112 is provided between the bit line BL and the bit line BL. The second interlayer insulating layer 112 contains, for example, silicon oxide.

The resistance change layer 120 stores data by a change in a resistance state. In addition, the resistance change layer 120 can rewrite data by application of voltage or current. The resistance change layer 120 transitions between a high resistance state and a low resistance state by application of voltage or current. For example, the high resistance state is defined as data "0", and the low resistance state is defined as data "1". The memory cell MC stores 1-bit data of "0" and "1".

The resistance change layer 120 contains, for example, a compound including germanium (Ge), antimony (Sb), and tellurium (Te). The resistance change layer 120 contains, for example, an alloy having a chemical composition of $Ge_2Sb_2Te_5$.

The resistance change layer 120 has a superlattice structure. The resistance change layer 120 contains, for example, $Ge_2Sb_2Te_5$, and has a superlattice structure in which $Ge_2Te_2$ regions and $Sb_2Te_3$ regions are alternately stacked. By application of voltage or current, the position of germanium (Ge) changes in the superlattice structure, and the superlattice structure transitions between a high resistance state and a low resistance state.

The selector layer 130 is provided between the bit line BL and the word line WL. The selector layer 130 is provided between the word line WL and the resistance change layer 120.

The selector layer 130 has non-linear current-voltage characteristics in which a current sharply rises at a specific voltage (hereinafter referred to as a threshold voltage). The selector layer 130 has a function of suppressing an increase in a semi-selective leak current flowing in a semi-selected cell.

The selector layer 130 contains a first element X selected from the group consisting of niobium (Nb), vanadium (V), tantalum (Ta), and titanium (Ti), and a second element Y selected from the group consisting of oxygen (O), sulfur (S), selenium (Se), and tellurium (Te). The selector layer 130 includes a first region 130a and a second region 130b.

The first region 130a contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te).

The second region 130b is provided between the first region 130a and the resistance change layer 120.

The second region 130b contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te).

The first region 130a and the second region 130b of the selector layer 130 each contain niobium oxide, vanadium oxide, tantalum oxide, titanium oxide, niobium sulfide, vanadium sulfide, tantalum sulfide, titanium sulfide, niobium selenide, vanadium selenide, tantalum selenide, titanium selenide, niobium telluride, vanadium telluride, tantalum telluride, or titanium telluride.

The first region 130a has a first atomic ratio (X/Y) of the first element X to the second element Y. The second region 130b has a second atomic ratio (X/Y) of the first element X to the second element Y.

The second atomic ratio is smaller than the first atomic ratio. In other words, the ratio of the first element X contained in the second region 130b is smaller than the ratio of the first element X contained in the first region 130a. In other words, the ratio of the first element X contained in the first region 130a is larger than the ratio of the first element X contained in the second region 130b. The second atomic ratio is, for example, equal to or less than 80% of the first atomic ratio.

For example, when the first element X is niobium (Nb) and the second element Y is oxygen (O), the first region 130a contains NbO and the second region 130b contains $NbO_2$. In this case, the first atomic ratio is 1, and the second atomic ratio is 0.5. The second atomic ratio is 50% of the first atomic ratio.

In the memory cell MC of the fifth embodiment, five layers of the first region 130a and four layers of the second region 130b are alternately stacked between the bit line BL and the word line WL. The first region 130a disposed between the second region 130b and the resistance change layer 120 is an example of a third region.

The first region 130a disposed between the second region 130b and the resistance change layer 120 contains the first element X selected from the group consisting of niobium (Nb), vanadium (V), tantalum (Ta), and titanium (Ti), and the second element Y selected from the group consisting of oxygen (O), sulfur (S), selenium (Se), and tellurium (Te). The first region 130a disposed between the second region 130b and the resistance change layer 120 has a third atomic ratio (X/Y) of the first element X to the second element Y. The third atomic ratio is larger than the second atomic ratio.

For example, the selector layer 130 has a superlattice structure. For example, the selector layer 130 has a superlattice structure in which the first region 130a and the second region 130b are alternately stacked. For example, when the first element X is niobium (Nb) and the second element Y is oxygen (O), the first region 130a contains NbO and the second region 130b contains $NbO_2$. For example, the selector layer 130 has a superlattice structure in which NbO and $NbO_2$ are alternately stacked.

The thickness of the selector layer 130 in a direction from the bit line BL to the word line WL is, for example, equal to or more than 5 nm and equal to or less than 20 nm. The thickness of the first region 130a in a direction from the bit line BL to the word line WL is, for example, equal to or more than 0.1 nm and equal to or less than 1 nm. The thickness of the second region 130b in a direction from the bit line BL to the word line WL is, for example, equal to or more than 0.1 nm and equal to or less than 1 nm.

As described above, according to the memory device of the fifth embodiment, a memory device capable of suppressing a semi-selective leak current can be achieved as in the first embodiment. In addition, since the memory cell array has a three-dimensional structure, the capacity of the memory device can be increased.

In the first to fourth embodiments, the case where the cross-point structure of the memory cell array is only one layer has been described as an example. However, for example, it is also possible to form a three-dimensional structure in which a plurality of the memory cell arrays of the first to fourth embodiments is stacked.

In the first to fifth embodiments, for example, the case where the resistance change memory has a superlattice structure has been described as an example. However, the memory device is not limited to this case as long as the memory device in which a current flows in a resistance change layer. The memory device may be a two-terminal memory device, a three- or four-terminal memory device. The memory device may be, for example, a phase change memory, a resistive random access memory, a magnetoresistive random access memory, or a ferroelectric random access memory other than the resistance change memory having a superlattice structure. The memory device may be a three- or four-terminal memory device using spin injection by spin orbit coupling in which topological insulator, such as chalcogenide, is used as a material causing spin orbit coupling. The positions of the resistance change layer and the selector layer can be switched with each other.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
   a first conductive layer;
   a second conductive layer;
   a resistance change region provided between the first conductive layer and the second conductive layer;
   a first region provided between the resistance change region and the first conductive layer, the first region including a first element selected from the group consisting of niobium (Nb), vanadium (V), tantalum (Ta), and titanium (Ti), and a second element selected from the group consisting of oxygen (O), sulfur (S), selenium (Se), and tellurium (Te), the first region having a first atomic ratio of the first element to the second element; and
   a second region provided between the first region and the resistance change region, the second region including the first element and the second element, the second region having a second atomic ratio of the first element to the second element, the second atomic ratio being smaller than the first atomic ratio.

2. The memory device according to claim 1, further comprising a third region provided between the second region and the resistance change region, the third region including the first element and the second element, the third region having a third atomic ratio of the first element to the second element, the third atomic ratio being larger than the second atomic ratio.

3. The memory device according to claim 1, wherein the second atomic ratio is equal to or less than 80% of the first atomic ratio.

4. The memory device according to claim 1, further comprising a third conductive layer provided between the second region and the resistance change region.

5. The memory device according to claim 1, wherein
   the first region has a thickness equal to or less than 1 nm in a direction from the first conductive layer to the second conductive layer, and
   the second region has a thickness equal to or less than 1 nm in the direction.

6. The memory device according to claim 1, wherein the first conductive layer has an oriented structure.

7. A memory device comprising:
a first conductive layer;
a second conductive layer;
a resistance change region provided between the first conductive layer and the second conductive layer;
a first region provided between the resistance change region and the first conductive layer, the first region including a first substance selected from the group consisting of carbon, niobium sulfide, tantalum sulfide, titanium sulfide, niobium selenide, tantalum selenide, tantalum telluride, bismuth selenide, indium selenide, and gallium telluride;
a second region provided between the first region and the resistance change region, the second region including a second substance selected from the group consisting of molybdenum sulfide, tungsten sulfide, molybdenum selenide, tungsten selenide, molybdenum telluride, tungsten telluride, zirconium sulfide, zirconium selenide, hafnium sulfide, and hafnium selenide; and
a third region provided between the second region and the resistance change region, the third region including the first substance.

8. The memory device according to claim 7, wherein
the first region has a thickness equal to or less than 1 nm in a direction from the first conductive layer to the second conductive layer, and
the second region has a thickness equal to or less than 1 nm in the direction.

9. The memory device according to claim 7, wherein the first conductive layer has an oriented structure.

10. A memory device comprising:
a plurality of first wires;
a plurality of second wires intersecting with the first wires; and
a memory cell disposed in at least one of regions where the first wires intersect with the second wires, wherein
the memory cell includes:
a resistance change region provided between the first wire and the second wire;
a first region provided between the resistance change region and the first wire, the first region including a first element selected from the group consisting of niobium (Nb), vanadium (V), tantalum (Ta), and titanium (Ti), and a second element selected from the group consisting of oxygen (O), sulfur (S), selenium (Se), and tellurium (Te), the first region having a first atomic ratio of the first element to the second element; and
a second region provided between the first region and the resistance change region, the second region including the first element and the second element, the second region having a second atomic ratio of the first element to the second element, the second atomic ratio being smaller than the first atomic ratio.

11. The memory device according to claim 10, wherein the memory cell includes a third region provided between the second region and the resistance change region, the third region including the first element and the second element, the third region having a third atomic ratio of the first element to the second element, the third atomic ratio being larger than the second atomic ratio.

12. The memory device according to claim 10, wherein the second atomic ratio is equal to or less than 80% of the first atomic ratio.

13. The memory device according to claim 10, wherein the memory cell further includes a conductive layer between the second region and the resistance change region.

14. The memory device according to claim 10, wherein the first region has a thickness equal to or less than 1 nm in a direction from the first wire to the second wire, and
the second region has a thickness equal to or less than 1 nm in the direction.

15. A memory device comprising:
a first conductive layer;
a second conductive layer;
a resistance change region provided between the first conductive layer and the second conductive layer;
a first region provided between the resistance change region and the first conductive layer, the first region including a first substance selected from the group consisting of carbon, niobium sulfide, tantalum sulfide, titanium sulfide, niobium selenide, tantalum selenide, tantalum telluride, bismuth selenide, indium selenide, and gallium telluride;
a second region provided between the first region and the resistance change region, the second region including a second substance selected from the group consisting of molybdenum sulfide, tungsten sulfide, molybdenum selenide, tungsten selenide, molybdenum telluride, tungsten telluride, zirconium sulfide, zirconium selenide, hafnium sulfide, and hafnium selenide; and
a third conductive layer provided between the second region and the resistance change region,
wherein
the first region has a thickness equal to or less than 1 nm in a direction from the first conductive layer to the second conductive layer, and
the second region has a thickness equal to or less than 1 nm in the direction.

* * * * *